US006661726B2

United States Patent
Aipperspach et al.

(10) Patent No.: US 6,661,726 B2
(45) Date of Patent: Dec. 9, 2003

(54) MULTIPLE MODE ELASTIC DATA TRANSFER INTERFACE

(75) Inventors: Anthony Gus Aipperspach, Rochester, MN (US); Derick Gardner Behrends, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 10/042,839

(22) Filed: Jan. 9, 2002

(65) Prior Publication Data

US 2003/0128611 A1 Jul. 10, 2003

(51) Int. Cl.[7] .................................................. G11C 7/00
(52) U.S. Cl. ............. 365/221; 365/189.01; 365/189.02; 710/1
(58) Field of Search ............................ 365/221, 189.01, 365/189.02, 220; 710/1

(56) References Cited

U.S. PATENT DOCUMENTS 5,926,643 A * 7/1999 Miura ........................... 712/7
6,334,163 B1 * 12/2001 Dreps et al. ................. 710/260

* cited by examiner

*Primary Examiner*—Richard Elms
*Assistant Examiner*—Nam Nguyen
(74) *Attorney, Agent, or Firm*—Bracewell & Patterson LLP

(57) ABSTRACT

Space, power and performance are improved by a memory device having multiple modes of operation for elastic data transfer. The memory device is comprised of first and second elastic store memory blocks, each containing 16 (18 bit) memory locations, and a write/read decoder. The first memory block receives write data from a first (18 bit) input data bus, and outputs two memory locations (36 bits) of read data onto a four memory location (72 bit) output data bus. The second memory block receives write data from multiplexed first and second (18 bit) input data buses and outputs two memory locations of read data onto the four memory location (72 bit) output data bus. The write address decoder receives a 5 bit write address, wherein the write address decoder will, as a function of a mode signal for effectively changing the address space for writing data, direct write data received at the data inputs of the first and second elastic store blocks to the correct memory locations. In one mode, data received on the first input data bus will get written to either the first or second memory, and, in another mode, data received on the first input data bus will be written to the first memory block and data received on the second input data bus will be written to the second memory block.

16 Claims, 4 Drawing Sheets

MULTIPLE MODE ELASTIC DATA TRANSFER INTERFACE

BACKGROUND OF THE INVENTION

1. Technical Field

The present invention relates generally to data storage in a data processing system, and in particular to a memory device used as an elastic data transfer interface in a data processing system. Still more particularly, the present invention relates to a memory device that can operate in multiple modes of operation to provide a configurable elastic data transfer interface within a data processing system.

2. Description of the Related Art

Shift registers can be used in parallel to form a first-in, first-out (FIFO) memory. These are typically register memories with independent input and output busses. At the input port, data is controlled by a shift-in clock operating in conjunction with an input ready signal which indicates whether the memory is able to accept further words or is now full. The data entered is automatically shifted in parallel to the adjacent memory location if it is empty, and as this continues, the data words stack up at the output end of the memory. At the output port, data transfers are controlled by a shift-out clock and its associated output ready signal. The output ready signal indicates either that a data word is ready to be shifted out, or that the memory is now empty. FIFOs can easily be cascaded to any desired depth and operated in parallel to give any required word length. This type of memory is widely used in controlling transfers of data between digital subsystems operating at different clock rates, and is often known as an elastic store memory or an elastic data transfer interface.

FIG. 1 is a diagram illustrating a conventional elastic store memory. The elastic store memory shown in FIG. 1 has addresses, 0 to N where N is an arbitrary number. The write operation and the read operation are separately carried out in the increasing order of address. After the address N is processed, address 0 is processed. Signals used on the write side of the elastic store memory are a Clock1, Input Data (write data), Write Inhibit and Write Reset. When the Write Reset signal is applied to the elastic store memory, the Write Address is set to be address 0. Signals used on the read side of the elastic memory to are a Clock2, Output Data (read data), Read Inhibit, Read Reset and phase comparison (PCO). When the Read Reset signal is applied to the elastic store memory, the read address is set to address 0.

The elastic store memory recognizes valid readout data during the time when data is successively read out from a storage area specified by an address to which the writing of input data is already completed. When the bit rate of the read operation is greater than that of the write operation, there is a possibility that data related to an address for which the writing of new (next) input data has not yet been carried out is read out from a storage location specified by the above address. In other words, the same data is twice read out from the same storage area. On the other hand, when the bit rate of the read operation is less than that of the write operation, there is a possibility that before data is read out from a storage area, new input data is written into the above storage location. In this case, the above data which has not yet been read out is lost. The above-mentioned re-reading of data and lack of data is defined as corruption of data.

Often, an elastic store memory is used in various applications of different frequencies. Rather than design separate elastic buffer designs for these separate applications, it would be desirable to provide a multi-mode elastic buffer that is configurable as an elastic data transfer interface for a selected set of frequencies. Moreover, it would be desirable for such a multi-mode data transfer interface to have the capability to dynamically compensate for discrepancies in the operating frequencies of the two subsystems being interfaced. By dynamically controlling the operation of the elastic data transfer interface to prevent data corruption, system efficiency is increased by reducing memory occupancies of halted input data.

SUMMARY OF THE INVENTION

According to a preferred embodiment, an improved memory device having multiple modes of operation for elastic data transfer is provided. The memory device includes a first elastic store memory containing a plurality of locations, and having a data input receiving write data from a first input data bus, and having a data output that outputs read data from the plurality of locations. A second elastic store memory contains a plurality of locations, and has a data input connected to a first input data bus or a second input data bus as a function of a mode signal, and having a data output that outputs read data from the plurality of locations, wherein the write data and read data are written into and read out from the first and second elastic store memories at a write timing and a read timing, respectively. A write address decoder receives a plurality of write address bits on a write address bus. The write address decoder directs, as a function of the mode signal, that write data received at the data inputs of the first and second elastic store memories is either: (i) alternately written into the first and second elastic store memories within separate address spaces as defined by separate values of the write address bits, or (ii) written into the first and second elastic store memories within the same address space as defined by the write address bits. The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention, a preferred mode of use, and its objects and advantages, will best be understood by reference to the following detailed description of an illustrative embodiment when read in conjunction with the accompanying drawings, wherein:

This invention is described in a preferred embodiment in the following description with reference to the figures, in which like numbers represent the same or similar elements.

DETAILED DESCRIPTION OF THE PREFERRED EMBODIMENT

Figure 1:
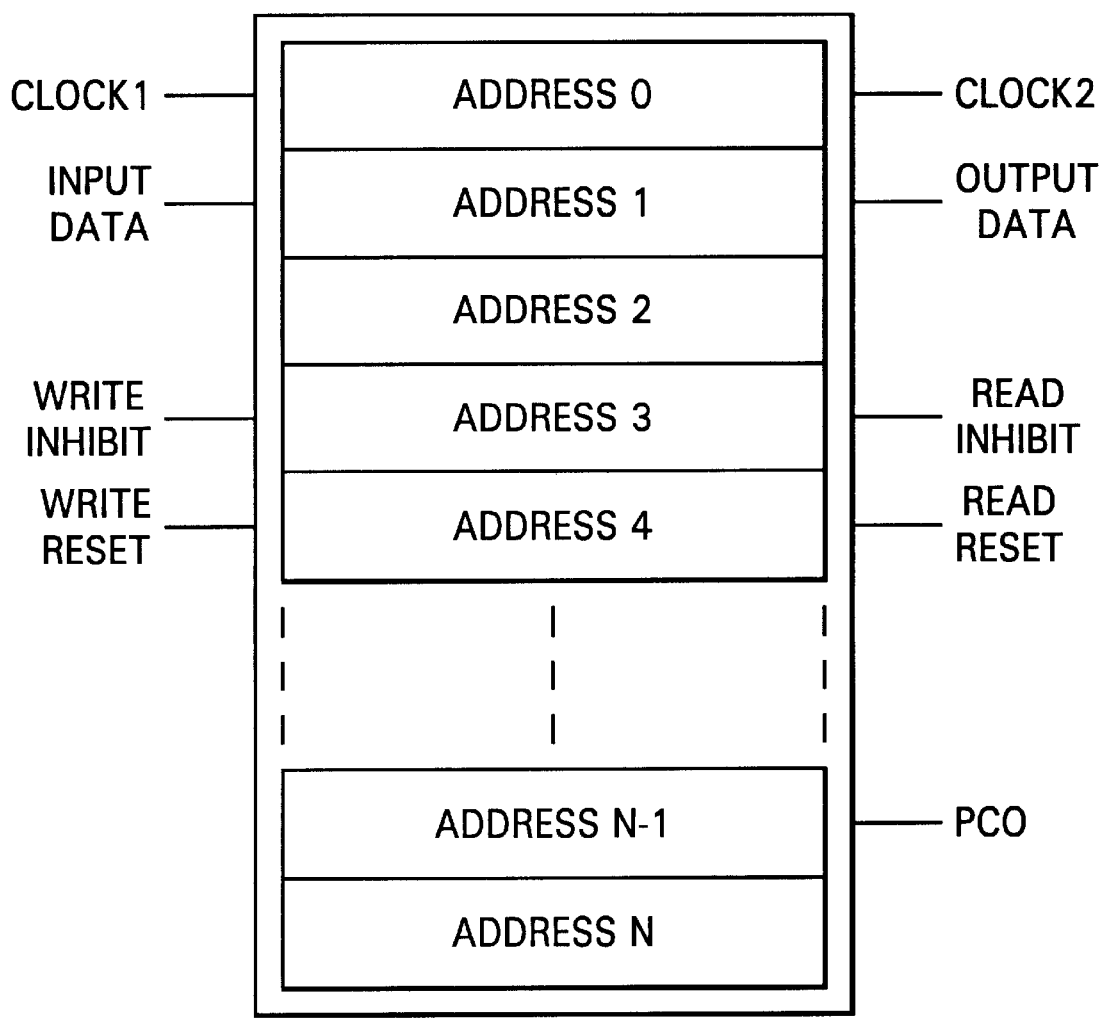
FIG. 1 is a diagram illustrating a conventional elastic store memory.
Figure 2:
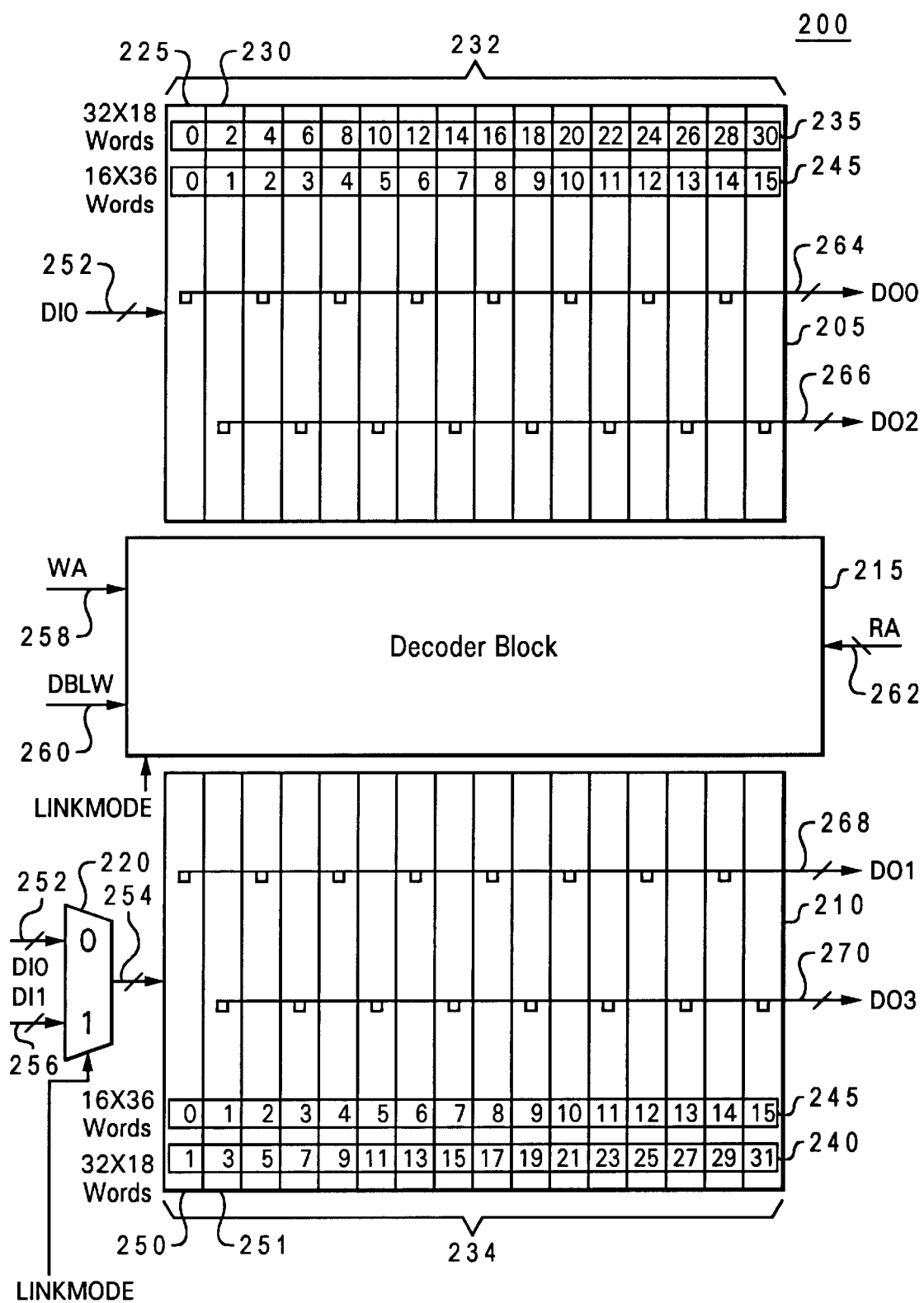
FIG. 2 is a diagram of a memory device in accordance with a preferred embodiment of the present invention.

In accordance with a preferred embodiment, FIG. 2 shows a block diagram of an elastic data transfer interface, in accordance with the preferred embodiment of the present invention. Elastic data transfer interface 200 has a first elastic store memory 205 and a second elastic store memory 210. Each elastic store memories 205, 210 contain a plurality of memory locations 232, 234, where each location is 18 bits wide, and where each elastic store memory has 16 locations. For example, elastic store memory 205 includes a location 225 represented by the vertical column on the left side of the diagram, and a next location 230 represented by the next vertical column to the right.

Elastic data transfer interface 200 may be configured to operate in one of two modes: (1) in a first mode, as a memory array of thirty-two, 18-bit addressable locations, and, (2) in a second mode, as a memory array of sixteen, 36-bit locations. The array configuration is set by the mode indicated by a LINKMODE signal. When the LINKMODE is set to logical zero, each of the memory locations in elastic store memories 205, 210 are addressed separately and the array is configured to store thirty-two 18-bit words. As shown in FIG. 2, when LINKMODE signal is set to logic zero, addresses 235 indicate each of the memory locations within elastic store memory 205 are addressed as 0, 2, 4, 6, 8, 10, 12, 14, 16, 18, 20, 22, 24, 26, 28 and 30 from left to right, respectively, and addresses 240 indicate the sixteen locations in the second elastic store memory 210 are addressed as 1, 3, 5, 7, 9, 11, 13, 15, 17, 19, 21, 23, 25, 27, 29 and 31 from left to right, respectively.

When LINKMODE is set to logical one, elastic data transfer interface 200 is configured with first elastic store memory 205 and second elastic store memory 210 linked together to operate as a single addressable memory block for storing 36-bit words contained within the sixteen addressable locations. When operating in the 36-bit configuration, each of the memory locations 232 are addressed consecutively using addresses 245 (0, 1, 2, 3, 4, 5, 6, 7, 8, 9, 10, 11, 12, 13, 14, and 15, respectively). Each memory location of memory locations 234 is linked to a parallel location of memory locations 232 and is addressed by the same address. When the array is configured in the 36-bit mode by the LINKMODE signal being set to logical one, each of memory locations 234 hold the upper parts of the 36-bit words, and each of the memory locations 232 in elastic store memory 205 hold the lower 18 bits of the 36-bit words. In other words, the 36-bit word stored in elastic data transfer interface 200 at logical address zero would have its lower 18 bits stored in memory location 225 and its upper 18 bits stored in memory location 250.

Elastic store memory 205 receives input data written on bus 252 (DI0) and elastic store memory 210 receives input data received from bus 254. Bus 254 is the output from multiplexer 220, where multiplexer 220 connects output bus 254 to bus 252 (DI0) if the LINKMODE signal connected to the control of multiplexer 220 is set to logical zero, or the output bus 254 is connected to input data bus 256 (DI1) when the LINKMODE is set is logical one. Therefore, when the memory array is configured in the 18-bit mode (LINKMODE=0), elastic store memories 205, 210 receive input write data from bus 252. When the memory array is configured in the 36-bit mode, the LINKMODE signal is set to logical one and elastic store memory 205 receives input write data from bus 252 and elastic store memory 210 receives input write data from bus 256. As will now be appreciated, when operating in the 18-bit mode, decoder 215 writes the received 18-bit data on the input bus 252 to the specifically addressed location in elastic store memories 205, 210. When operating in the 36-bit mode, elastic store memory 205 receives the lower half of the 36-bit word on bus 252 and elastic store memory 210 receives the upper half of the 36-bit word from bus 256. Decoder 215 then writes the upper and lower halves of the received 36-bit word to the addressed location in elastic store memory 205 and the linked location in elastic store memory 210.

Decoder 215 receives a write address (WA) on bus 258. In a preferred embodiment, the write address is a 5-bit address. The 5 bits received over bus 258 are decoded by decoder 215 into one of 32 possible locations within elastic data transfer interface 200. If elastic data transfer interface 200 is operating in the 36-bit mode, the least significant bit of the write address received over bus 258 is ignored and one of sixteen possible addresses is decoded by decoder 215 to address a memory location in memory locations 232 and its linked memory location in memory locations 234.

In a preferred embodiment, decoder 215 is capable of operating in a Double-Write (DBLW) mode. In the double-write mode, two consecutive address locations within elastic data transfer interface 200 are written at the same time. In this mode, two word lines within each of the memory locations 232 and memory locations 234 are active at the same time. When elastic data transfer interface 200 is operating in the 18-bit mode, the addressed memory location within memory locations 232, 234 is addressed along with the next consecutively addressed location. For example, in the 18-bit mode, a write to address "0" would write the data on bus 252 into memory location 225. Simultaneously, address "1" within addresses 240 would also be addressed (activated), enabling memory location 250 to be written by the same 18-bits on bus 252 via bus 254. Similarly, when elastic data transfer interface 200 is operating in the 36-bit mode, one of the location addresses 245 is addressed by a write operation, the next consecutive location address is also activated. So, for example, if the write address on bus 258 is addressed "0", an active DBLW signal on bus 260 would cause decoder 215 to enable the address locations 225 and 250 at address "0", and would also enable the next consecutively addressed locations 230 and 251 at address "1". This would cause the 18-bits representing the lower half of 36-bit word on bus 252 to be written to locations 225 and 230 and the 18-bits representing the upper half of the 36-bit word on bus 256 to be written into locations 250 and 251. As will be appreciated, use of the Double-Write function enables the system software or operator to dynamically adjust the speed of writes to the elastic memory storage to adjust for discrepancies in read and write frequencies of the system.

Elastic data transfer interface 200 outputs read data addressed by a read address on read address bus 262 on four output busses 264, 266, 268, 270. As seen in FIG. 2 decoder 215 receives a read address (RA) on 3-bit bus 262. Decoder 215 contains a "3-8" decoder that enables each of output busses 264, 266, 268, 270 to output the 18-bits from a separate location of memory locations 232, 234. Thus, independent of the LINKMODE, read busses 264–270 outputs the 72 read bits from two consecutive locations 232 in elastic store memory 205 and two consecutive locations in elastic location 210. If the data in those locations had been stored in the 18-bit mode, a specific read equals four consecutive 18-bit words. In the 36-bit mode, the read equals two consecutive 36-bit words (comprising the upper eighteen and lower eighteen bits of each word from elastic store memories 210, 205, respectively). Consequently, there are only eight logical and eight physical read address locations in elastic data transfer interface 200 (note that the even words are stored in elastic store memory 205 and the odd words are stored in elastic store memory 210).

Therefore, as will now be appreciated, write data received at the data inputs of the first and second elastic store memories is either: (i) alternately written into the first and second elastic store memories within separate address spaces as defined by separate sets of write address bits, or (ii) simultaneously written into the first and second elastic store memories within the same address space as defined by a set of write address bits.

Figure 3:
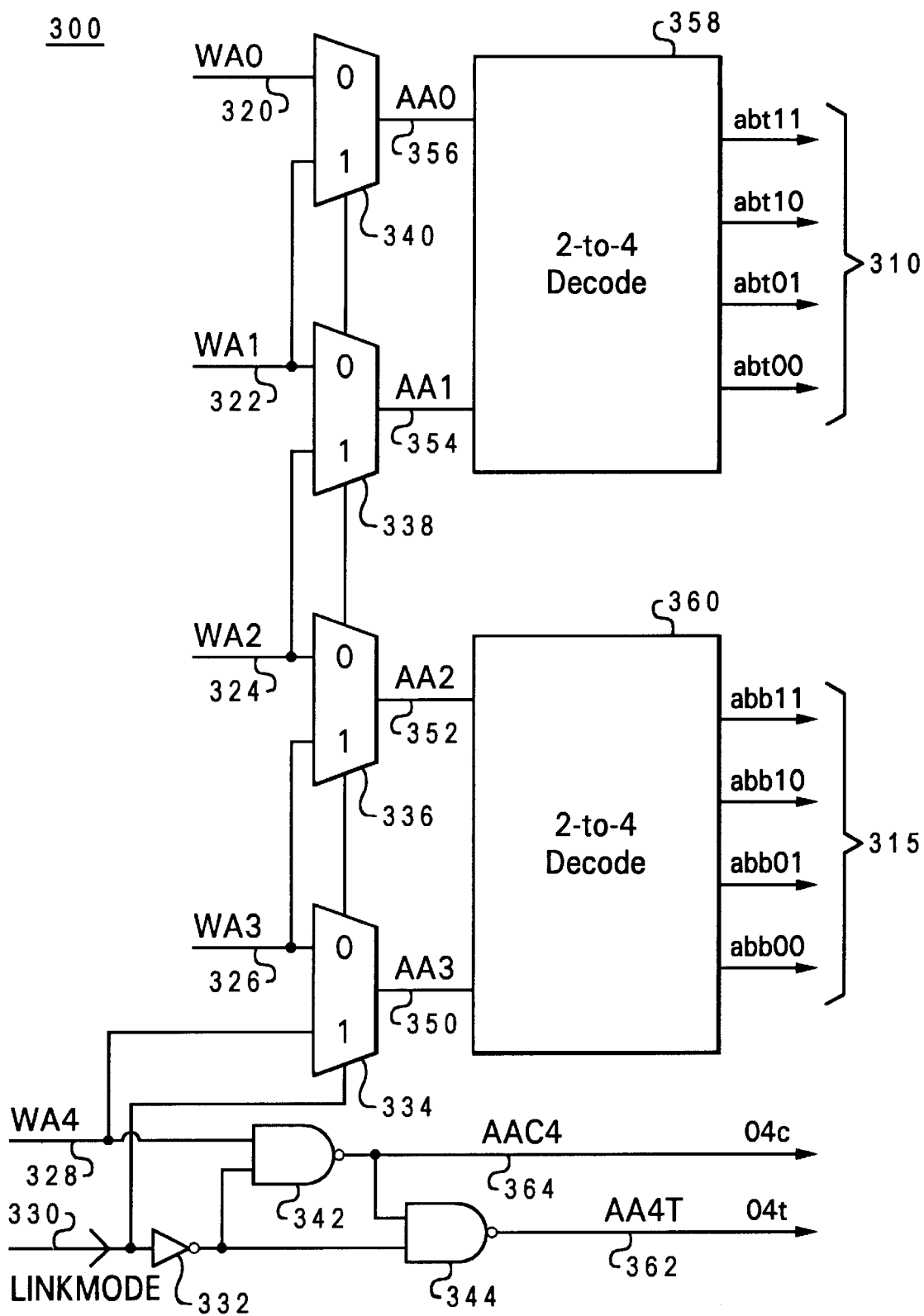
FIG. 3 depicts a decoder in accordance with a preferred embodiment of the present invention.

With reference now to FIG. 3, there is shown a block diagram of a decoder 300 as is used in a preferred embodiment of the present invention. Decoder 300 is embodied within decoder block 215 and is used to decode the write address received at bus 258 into the appropriate enable signals 310, 315 for enabling the addressed memory location (s) within memory locations 232, 234. The write address received at write address bus 258 is split into write address bits WA0, WA1, WA2, WA3 and WA4 (WA0–WA4, collectively), which are each applied to inputs 320, 322, 324, 326 and 328, respectively. The LINKMODE signal is received at node 330, which is input into inverter 332 and to the control terminal of multiplexer 334, multiplexer 336, multiplexer 338 and multiplexer 340. The output of inverter 332 is connected to an input terminal of NAND gate 342 and NAND gate 344. The second input terminal of NAND gate 342 is connected to node 328 to receive the fifth bit (WA4) of the write address received at write address bus 258. The second input to NAND gate 344 is connected to the output of NAND gate 342. The outputs of multiplexers 334, 336, 338, and 340, produce array address bits AA0, AA1, AA2, and AA3, respectively (output on outputs 350, 352, 354, 356, respectively).

Decoder 358 is a 2-to-4 decoder that decodes the two array address bits AA0 and AA1 into a four bit code 310. Decoder 360 is a 2-to-4 decoder that decodes the array address bits AA2 and AA3 into a four bit address signal 315. NAND gate 344 produces a fourth array address bit (AA4T) and NAND gate 342 produces the compliment (inverse) of the fourth array address bit (AA4C).

The operation of decoder 300 is now described. The translation or decoding of The write address is performed as a function of the LINKMODE signal, and more Specifically, on whether the memory array is operating in the 18-bit or 36-bit mode. When LINKMODE is set to a logical zero, the array is configured in the 18-bit mode and elastic store memory 205 and elastic store memory 210 are operated as separate address spaces. Therefore, all five write address bits WA0–WA4 are each decoded by decoder 300 in order to enable the appropriate word line from among the thirty-two addressable locations. A zero input at the control terminal of multiplexers 334–340 allows WA0 to input to decoder 358 as array address zero (AA0) at input 356, and WA1 to input to decoder 358 as array address one (AA1) at input 354. A zero input at the control terminals of multiplexers 334 and 336 passes WA2 as array address zero (AA2) to input terminal 352 and WA3 as array address zero (AA3) to input terminal 350 of decoder 360. The true signal and compliment signals for each of the decoded address signals WA0–WA3 are presented at the outputs 310, 315. The true and compliment signals of WA4 are output as signals 362, 364. These signals can be used to enable the addressed memory location using standard decoder circuitry as is well know in the art.

When the LINKMODE is a logical one, indicating that the memory array is operating in the 36-bit mode, the logical one at the control terminals of multiplexers 334–340 transfers WA1 to input 356 of decoder 358 and signal WA2 to input 354 of decoder 358. It also causes signal WA3 to input at terminal 352 of decoder 360 and signal WA4 to input at terminal 350 of decoder 360. Moreover, the logically high LINKMODE at terminal 330 generates a high output at both terminals 362 and 364. As will now be appreciated, the least significant array address bit (AA4T) and its complement (AA4C), both go to the logical one state when the LINKMODE signal is at the logical one state. In other words, when the LINKMODE signal is at a logical high, the array address is defined by the four bit address WA1–WA4, and the write address bits are shifted one significant place so that the decoder 300 will be set to address one 36-bit word at a time.

Figure 4:
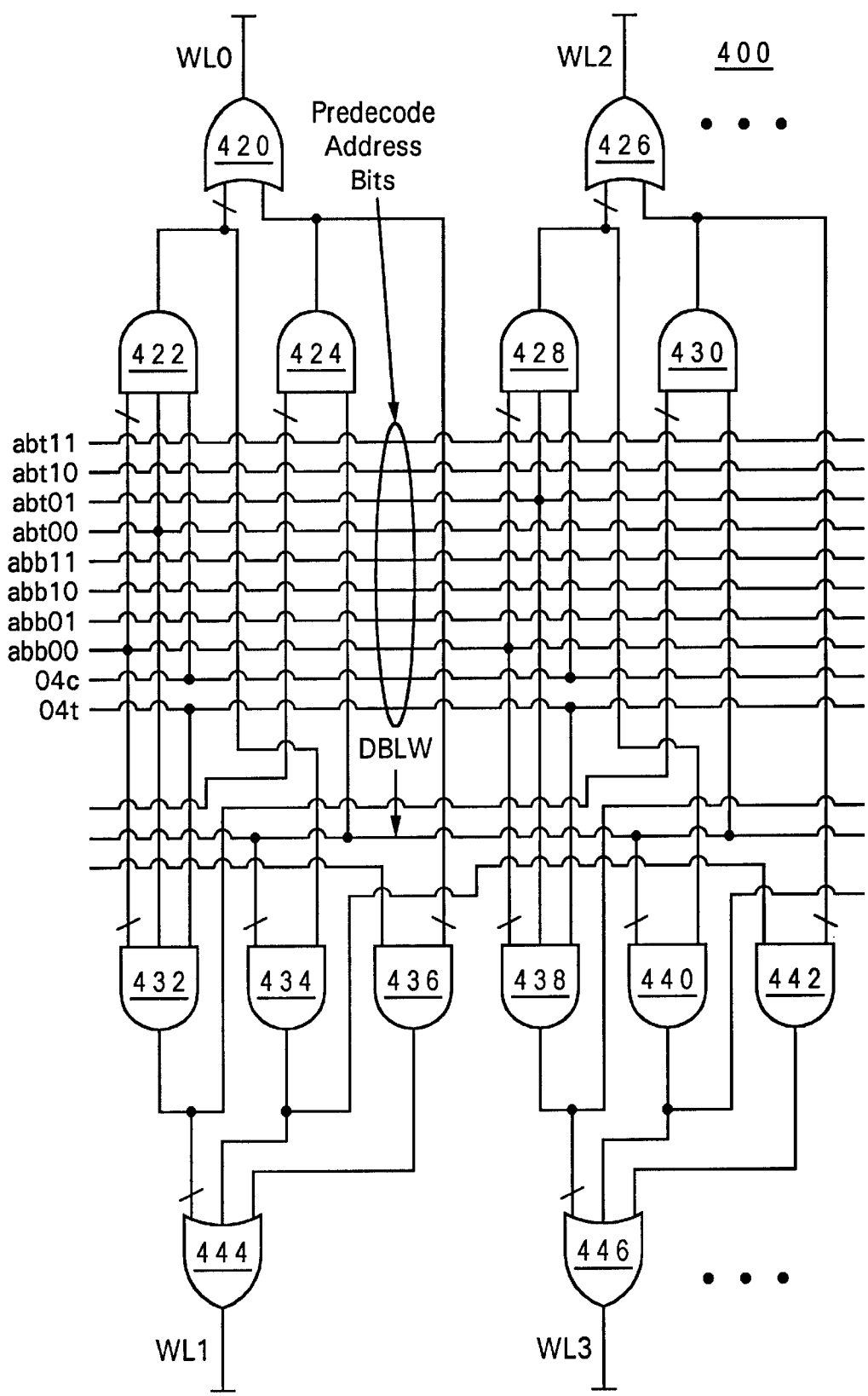
FIG. 4 shows a circuit for consecutive wordlines in the decoder in accordance with a preferred embodiment of the present invention.

FIG. 4 shows a circuit 400 for consecutive wordlines in the decode block 215, in accordance with a preferred embodiment of the present invention. Circuit 400 includes: OR gates 420, 444, 426, 446; 2-input AND gates 424, 430, 434, 436, 440, and 442, and 3-input AND gates 422, 428, 432 and 438. For addressing block 215, five bits labeled WA0, WA1, WA2, WA3, WA4 are used, where WA0 is the most significant bit. The wordlines are labeled wordline 0 (WL0), wordline 1 (WL1), wordline 2 (WL2), and wordline 3 (WL3). The following tables describe the address to wordline translation for the different modes.

32 wordline mode (linkmode=0), normal write (doublewrite=0)
A0,A1,A2,A3,A4 |wordlines firing
0, 0, 0, 0, 0=wordline 0
0, 0, 0, 0, 1=wordline 1
0, 0, 0, 1, 0=wordline 2
0, 0, 0, 1, 1=wordline 3
32 wordline mode (linkmode=0), double write (doublewrite=1)
A0,A1,A2,A3,A4 | wordlines firing
0, 0, 0, 0, 0=wordline 0,wordline1
0, 0, 0, 0, 1=wordline 1,wordline2
0, 0, 0, 1, 0=wordline 2,wordline3
0, 0, 0, 1, 1=wordline 3,wordline4(not shown)
16 wordline mode (linkmode=1), normal write (doublewrite=0)
A1,A2,A3,A4 | wordlines firing
0, 0, 0, 0=wordline 0,wordline1 (combined in this mode they become wordline0)
0, 0, 0, 1=wordline 2,wordline3 (combined in this mode they become wordline1)
0, 0, 1, 0=wordline 4,wordline5 (neither is shown)
0, 0, 1, 1=wordline 6,wordline7 (neither is shown)
16 wordline mode (linkmode=1), normal write (doublewrite=1)
A1,A2,A3,A4 |wordlines firing
0, 0, 0, 0=wordline 0,wordline1,wordline2,wordline3
  (in this mode wordline0 and wordline1 combine to make wordline0 and wordline2 and wordline3 combine to make wordline1)
0, 0, 0, 1=wordline 2,wordline3,wordline4,wordline5
  (neither wordline4 nor wordline5 is shown)
0, 0, 1, 0=wordline 4,wordline5,wordline6,wordline7 (none are shown)
0, 0, 1, 1=wordline 6,wordline7,wordline8,wordline9 (none are shown)

Enabling a wordline is a function of several different variables. Wordline, WL0 is comprised of a 2-input OR gate 420 fed by a 3-input AND gate 422 and a 2-input AND gate 424. The 3-input AND gate 422 is the combination of predecode wordlines from two 2 to 4 decoders 358, 360 and a single true/compliment generator (342, 344) for the WA4 signal. This means there are 10 predecode lines running in between the top/even (WL0, WL2, WL4 . . . WL32) and bottom/odd wordlines (WL1, WL3, WL5 ... WL31). Each 2 to 4 decoder 358, 360 provides four inputs and the true/compliment generator provides two. The inputs to the AND gate 422 use these 10 signals to derive the correct function that is described in the tables above. As seen in FIG. 4, the first input of AND gate 422 is hooked up to one of four outputs from the 2-to-4 decode 358. The second input to AND gate 422 is hooked to one of four outputs from the second 2 to 4 decoder 360. The third input comes from the compliment of the WA4 signal (AA4C). AA4C is connected to all of the top wordlines and the true of WA4 (AA4T) is connected to all of the bottom wordlines. This is done so that when WA4 is low, indicating an even address, a top wordline will enable (fire), and vice versa.

In 16 wordline mode, the LINKMODE signal is combined with the WA4 signal in such a way that causes both AA4T and AA4C to transition and stay high when the LINKMODE signal is high. As seen in the tables above, the address bits all shift down one bit and the WA0 signal is discarded when LINKMODE is high. By having both AA4T and AA4C high, two consecutive wordlines will fire.

When the decoder 215 is in the double write mode, in 32 wordline mode (LINKMODE=0). When wordline0 fires (caused by AND gate 422) and doublewrite signal (DBLW) is high, through the output of AND gate 422 to AND gate 434, wordline1 fires. When wordline1 fires (caused by AND gate 432) and DBLW is high, output of AND gate 432 to AND gate 430 will cause wordline2 to also fire. This continues and wraps by having wordline31 (not shown) fire wordline0. When in double write mode (DBLW is high) and 16 wordline mode (LINKMODE=1), wordline0 (caused by AND gate 422) and wordline1 (caused by AND gate 432) will both fire. From the description in the previous paragraph wordline1 will cause wordline2 to fire when DBLW is high. Then the output of AND gate 430 followed to the input of AND gate 442 will cause wordline3, the last and final wordline of this mode, to fire.

While this invention is described in terms of the best mode for achieving this invention's objectives, it will be appreciated by those skilled in the art that variations may be accomplished in view of these teachings without deviating from the spirit or scope of the present invention. For example, the present invention may be implemented using any combination of computer programming software, firmware or hardware. As a preparatory step to practicing the invention or constructing an apparatus according to the invention, the computer programming code (whether software or firmware) according to the invention will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the computer programming code is used by either executing the code directly from the storage device, by copying the code from the storage device into another storage device such as a hard disk, RAM, etc. or by transmitting the code for remote execution. The method form of the invention may be practiced by combining one or more machine readable storage devices containing the code according to the present invention with appropriate standard computer hardware to execute the code contained therein. An apparatus for practicing the invention could be one or more computers and storage systems containing or having network access to computer program(s) coded in accordance with the invention.

What is claimed is:

1. A memory device for elastic data transfer, comprising:
    a first elastic store memory containing a plurality of locations, and having a data input receiving write data from a first input data bus, and having a data output that outputs read data from the plurality of locations;
    a second elastic store memory containing a plurality of locations, and having a data input connected to a first input data bus or a second input data bus as a function of a mode signal, and having a data output that outputs read data from the plurality of locations, wherein the write data and read data are written into and read out from the first and second elastic store memories at a write timing and a read timing, respectively; and
    a write address decoder receiving a plurality of write address bits at write address bus, wherein the write address decoder will, as a function of the mode signal, direct that write data received at the data inputs of the first and second elastic store memories is: (i) alternately written into the first and second elastic store memories within separate address spaces as defined by separate values of the write address bits, or (ii) written into the first and second elastic store memories within the same address space as defined by the write address bits.

2. The memory device of claim 1, further comprising an input data bus multiplexor connected to the first input data bus and the second input data bus, and having an output connecting the first input data bus or the second input data bus to the second elastic store memory as a function of the mode signal.

3. The memory device of claim 1, wherein, in a first mode indicated by the mode signal, the write address decoder selects, as indicated by the plurality of write address bits, either one or more locations of the first elastic store memory or one or more locations of the second elastic store memory, and wherein, in a second mode indicated by the mode signal, the write address decoder selects one or more locations of the first elastic store memory indicated by the plurality of write address bits and one or more locations of the second elastic store memory linked to the selected one or more locations of the first elastic store memory.

4. The memory device of claim 3, wherein the write address decoder selects two locations of the first elastic store memory in response to a double write signal.

5. The memory device of claim 1, further comprising:
    a read address decoder, including a selecting circuit coupled to the data outputs of the first and second elastic store memories, wherein the selecting circuit selects one or more of the locations of the first elastic store memory and one or more locations of the second elastic store memory as a function of a received read address, and wherein read data is read out from selected locations of the first and second elastic store memories at the same time.

6. A method of elastic data transfer in a data transfer interface device, comprising:
    writing, as a function of a mode signal, write data received at the data inputs of a first elastic store memory and a second elastic store memory either: (i) alternately into the first and second elastic store memories within separate address spaces as defined by separate values of write address bits, or (ii) into the first and second elastic store memories within the same address space as defined by write address bits.

7. A method of claim 6, further comprising:
    receiving write data from a first input data bus at a data input of a first elastic store memory containing a plurality of locations and having a data output that outputs read data from the plurality of locations;

connecting an output of the first input data bus or a second input data bus as a function of a mode signal at an input data bus multiplexor connected to the first input data bus and the second input data bus;

receiving write data from the input data bus multiplexor at a data input of a second elastic store memory containing a plurality of locations, having a data output and being connected to the input data bus multiplexor, and outputting read data from the plurality of locations, wherein the write data and read data are written into and read out from the first and second elastic store memories at a write timing and a read timing, respectively; and receiving a plurality of write address bits at a write address bus of a write address decoder.

8. The method of claim 7, further comprising:

selecting one or more of the locations of the first elastic store memory and one or more locations of the second elastic store memory as a function of a received read address; and reading from selected locations of the first and second elastic store memories substantially simultaneously.

9. The method of claim 6, further comprising:

in a first mode indicated by the mode signal, selecting, as indicated by the plurality of write address bits, either one or more locations of the first elastic store memory or one or more locations of the second elastic store memory;

in a second mode indicated by the mode signal, selecting one or more locations of the first elastic store memory indicated by the plurality of write address bits and one or more locations of the second elastic store memory linked to the selected one or more locations of the first elastic store memory.

10. The method of claim 6, further comprising selecting two locations of the first elastic store memory in response to a double write signal.

11. An article of manufacture for elastic data transfer, the article of manufacture comprising computer readable storage media including program logic embedded therein that causes control circuitry to perform the steps of:

writing, as a function of the mode signal, write data received at data inputs of a first elastic store memory and a second elastic store memory either: (i) alternately into the first and second elastic store memories within separate address spaces as defined by separate values of write address bits, or (ii) into the first and second elastic store memories within the same address space as defined by write address bits.

12. The article of manufacture of claim 11, further comprising program logic embedded therein that causes control circuitry to perform the steps of:

receiving write data from a first input data bus at a data input of a first elastic store memory containing a plurality of locations and having a data output that outputs read data from the plurality of locations;

connecting an output of the first input data bus or a second input data bus as a function of a mode signal at an input data bus multiplexor connected to the first input data bus and the second input data bus;

receiving write data from the input data bus multiplexor at a data input of a second elastic store memory containing a plurality of locations, having a data output and being connected to the input data bus multiplexor, and outputting read data from the plurality of locations, wherein the write data and read data are written into and read out from the first and second elastic store memories at a write timing and a read timing, respectively; and receiving a plurality of write address bits at a write address bus of a write address decoder.

13. The article of manufacture of claim 12, further comprising program logic embedded therein that causes control circuitry to perform the steps of:

selecting one or more of the locations of the first elastic store memory and one or more locations of the second elastic store memory as a function of a received read address; and reading from selected locations of the first and second elastic store memories.

14. The article of manufacture of claim 11, further comprising program logic embedded therein that causes control circuitry to perform the steps of:

in a first mode indicated by the mode signal, selecting, as indicated by the plurality of write address bits, either one or more locations of the first elastic store memory or one or more locations of the second elastic store memory;

in a second mode indicated by the mode signal, selecting one or more locations of the first elastic store memory indicated by the plurality of write address bits and one or more locations of the second elastic store memory linked to the selected one or more locations of the first elastic store memory.

15. The article of manufacture of claim 11, further comprising program logic embedded therein that causes control circuitry to perform the step of selecting two locations of the first elastic store memory in response to a double write signal.

16. The article of manufacture of claim 11, further comprising program logic embedded therein that will, as a function of the mode signal, direct that write data received at the data inputs of the first and second elastic store memories is written other than (i) and (ii).

* * * * *